US008798191B2

(12) United States Patent
Matsuura

(10) Patent No.: US 8,798,191 B2
(45) Date of Patent: Aug. 5, 2014

(54) TRANSMISSION APPARATUS, RADIO COMMUNICATION APPARATUS, AND TRANSMISSION METHOD

(75) Inventor: Toru Matsuura, Kanagawa (JP)

(73) Assignee: Panasonic Corporation, Osaka (JP)

(*) Notice: Subject to any disclaimer, the term of this patent is extended or adjusted under 35 U.S.C. 154(b) by 354 days.

(21) Appl. No.: 13/256,186

(22) PCT Filed: Dec. 17, 2010

(86) PCT No.: PCT/JP2010/007339
§ 371 (c)(1),
(2), (4) Date: Sep. 12, 2011

(87) PCT Pub. No.: WO2011/086640
PCT Pub. Date: Jul. 21, 2011

(65) Prior Publication Data
US 2012/0002754 A1    Jan. 5, 2012

(30) Foreign Application Priority Data
Jan. 15, 2010  (JP) .................................. 2010-006906

(51) Int. Cl.
*H04L 27/04*    (2006.01)
*H03F 3/24*    (2006.01)
*H03F 3/195*    (2006.01)
*H03F 3/189*    (2006.01)
*H03F 1/02*    (2006.01)
*H03F 1/32*    (2006.01)
*H04B 1/04*    (2006.01)

(52) U.S. Cl.
CPC ............... *H03F 1/3247* (2013.01); *H03F 3/24* (2013.01); *H03F 2200/451* (2013.01); *H03F 3/195* (2013.01); *H03F 3/189* (2013.01); *H03F 1/0222* (2013.01); *H03F 2200/336* (2013.01); *H04B 1/0475* (2013.01); *H03F 1/3294* (2013.01)
USPC ............ 375/295; 375/219; 375/222; 375/296

(58) Field of Classification Search
USPC ........................ 375/219, 222, 268, 295–300
See application file for complete search history.

(56) References Cited

U.S. PATENT DOCUMENTS 6,937,688 B2    8/2005  Chen
7,126,999 B2 *  10/2006 Dent ............................ 375/261

(Continued)

FOREIGN PATENT DOCUMENTS

| JP | 2005-57665 | 3/2005 |
| JP | 2005-244950 | 9/2005 |
| JP | 2008-48052 | 2/2008 |

OTHER PUBLICATIONS

International Search Report dated Jan. 25, 2011.

*Primary Examiner* — Shuwang Liu
*Assistant Examiner* — Ross Varndell
(74) *Attorney, Agent, or Firm* — Dickinson Wright PLLC

(57) ABSTRACT

Disclosed is a transmission apparatus, a radio communication apparatus, and a transmission method for making it possible to obtain stable characteristics by controlling the difference of time between an amplitude signal and a phase signal to an optimal point, without depending on a modulated signal nor making the circuit size larger. A multiplier (170) generates, in a pseudo manner, a digital modulated signal corresponding to a signal that is obtained by performing analog to digital conversion on a modulated signal that is generated by an amplitude modulator (140), by multiplying a digital amplitude signal that is obtained by performing analog to digital conversion on an amplitude signal by a digital angle modulated signal corresponding to a signal that is obtained by performing analog to digital conversion on an angle modulated signal. Distortion calculation section (180) calculates distortion of the digital modulated signal, control section (190) controls delay time based on the distortion of the digital modulated signal, and delay adjustment section (130) adjusts delay time until the amplitude signal is input to amplitude modulator (140), or delay time until the angle modulated signal is input to amplitude modulator (140).

8 Claims, 12 Drawing Sheets

(56) References Cited

U.S. PATENT DOCUMENTS

| | | | |
|---|---|---|---|
| 7,409,004 B2 * | 8/2008 | Booth et al. | 375/295 |
| 2003/0206056 A1 * | 11/2003 | Hietala | 330/100 |
| 2005/0046507 A1 * | 3/2005 | Dent | 332/103 |
| 2005/0164660 A1 | 7/2005 | Matsuura | |
| 2005/0245208 A1 * | 11/2005 | Udagawa et al. | 455/102 |
| 2006/0057976 A1 * | 3/2006 | Klemmer | 455/102 |
| 2006/0246856 A1 | 11/2006 | Udagawa | |
| 2007/0053463 A1 * | 3/2007 | Hara | 375/295 |
| 2007/0142005 A1 * | 6/2007 | Sundstrom | 455/126 |
| 2009/0252255 A1 * | 10/2009 | Lee et al. | 375/297 |

* cited by examiner

TRANSMISSION APPARATUS, RADIO COMMUNICATION APPARATUS, AND TRANSMISSION METHOD

CROSS-REFERENCE TO RELATED APPLICATIONS

This is a national stage of PCT/JP2010/007339 filed Dec. 17, 2010, which is based on Japanese Application No. 2010-006906 filed Jan. 15, 2010, the entire contents of which are incorporated by reference herein.

TECHNICAL FIELD

The present invention relates to a transmission apparatus, a radio communication apparatus, and a transmission method used for communication devices such as a mobile phone and a wireless LAN.

BACKGROUND ART

A modulator of a conventional transmission apparatus is described below. FIG. 1 shows a modulator of a conventional transmission apparatus disclosed in FIG. 3 of Patent Literature 1.

An amplitude signal and a phase signal are input from input terminal 10-1 and input terminal 10-2, respectively. The amplitude signal is input to amplitude modulator 13 via variable delay section 11 that can change delay time. On the other hand, the phase signal, which is input to input terminal 10-2, is input to angle modulator 12, where the phase signal is angle modulated, and then, is input to the other input of amplitude modulator 13. Amplitude modulator 13 amplitude modulates the angle modulated signal output from angle modulator 12 with the amplitude signal output from variable delay section 11, and the output signal of amplitude modulator 13 is output from output terminal 17.

As described above, the configuration in which signal processing is performed separately on an amplitude signal and a phase signal, and these signals are amplitude modulated in a amplitude modulator is called "polar modulation." In this kind of polar modulator, when there is a difference between the time in the path in which an amplitude signal passes and the time in the path in which a phase signal passes, a spectrum of the output signal deteriorates, so that it is necessary to accurately match these times each other.

In FIG. 1, control is performed using minimum amplitude detector 14, phase jump detector 15, delay control section 16, variable delay section 11, so that the delay time in each path matches each other.

CITATION LIST

Patent Literature

PTL 1
U.S. Pat. No. 6,937,668

SUMMARY OF INVENTION

Technical Problem

However, the method shown in FIG. 1 has a problem that it is difficult to detect a phase jump when a signal does not pass through the vicinity of the origin.

It is therefore an object of the present invention to provide a transmission apparatus, a radio communication apparatus, and a transmission method having stable characteristics by controlling the difference of time between an amplitude signal and a phase signal to an optimal point, without depending on a modulated signal nor making the circuit size larger.

Solution to Problem

A transmission apparatus according to the present invention employs a configuration to comprise an angle modulation section that generates an angle modulated signal in a radio frequency domain using an angle signal of an input signal; an amplitude modulator that generates a modulated signal by amplifying power of the angle modulated signal according to an amplitude signal of the input signal; a first generation section that generates a digital amplitude signal by performing analog to digital conversion on the amplitude signal; a second generation section that generates a digital angle modulated signal corresponding to a signal obtained by performing analog to digital conversion on the angle modulated signal; a multiplier that generates, in a pseudo manner, a digital modulated signal corresponding to a signal that is obtained by performing analog to digital conversion on the modulated signal, by multiplying the digital amplitude signal by the digital angle modulated signal; a distortion calculation section that calculates distortion of the digital modulated signal; an adjustment section that adjusts delay time until the amplitude signal is input to the amplitude modulator, or delay time until the angle modulated signal is input to the amplitude modulator; and a control section that controls the delay time based on the distortion.

A transmission method according to the present invention employs a configuration to generate an angle modulated signal in a radio frequency domain using an angle signal of an input signal; amplify power of the angle modulated signal according to an amplitude signal of the input signal; generate a digital amplitude signal by performing analog to digital conversion on the amplitude signal; generate, in a pseudo manner, a digital angle modulated signal corresponding to a signal that is obtained by performing analog to digital conversion on the angle modulated signal; generate a digital modulated signal by multiplying the digital amplitude signal by the digital angle modulated signal; calculate distortion of the digital modulated signal; adjust delay time until the amplitude signal is input to an amplitude modulator, or delay time until the angle modulated signal is input to the amplitude modulator; and control the delay time based on the distortion.

Advantageous Effects of Invention

According to the present invention, it is possible to obtain stable characteristics by controlling the difference of time between an amplitude signal and a phase signal to an optimal point, without depending on a modulated signal nor making the circuit size larger.

DESCRIPTION OF EMBODIMENTS

Now, embodiments of the present invention will be described in detail with reference to the accompanying drawings.

Embodiment 1

Figure 2:
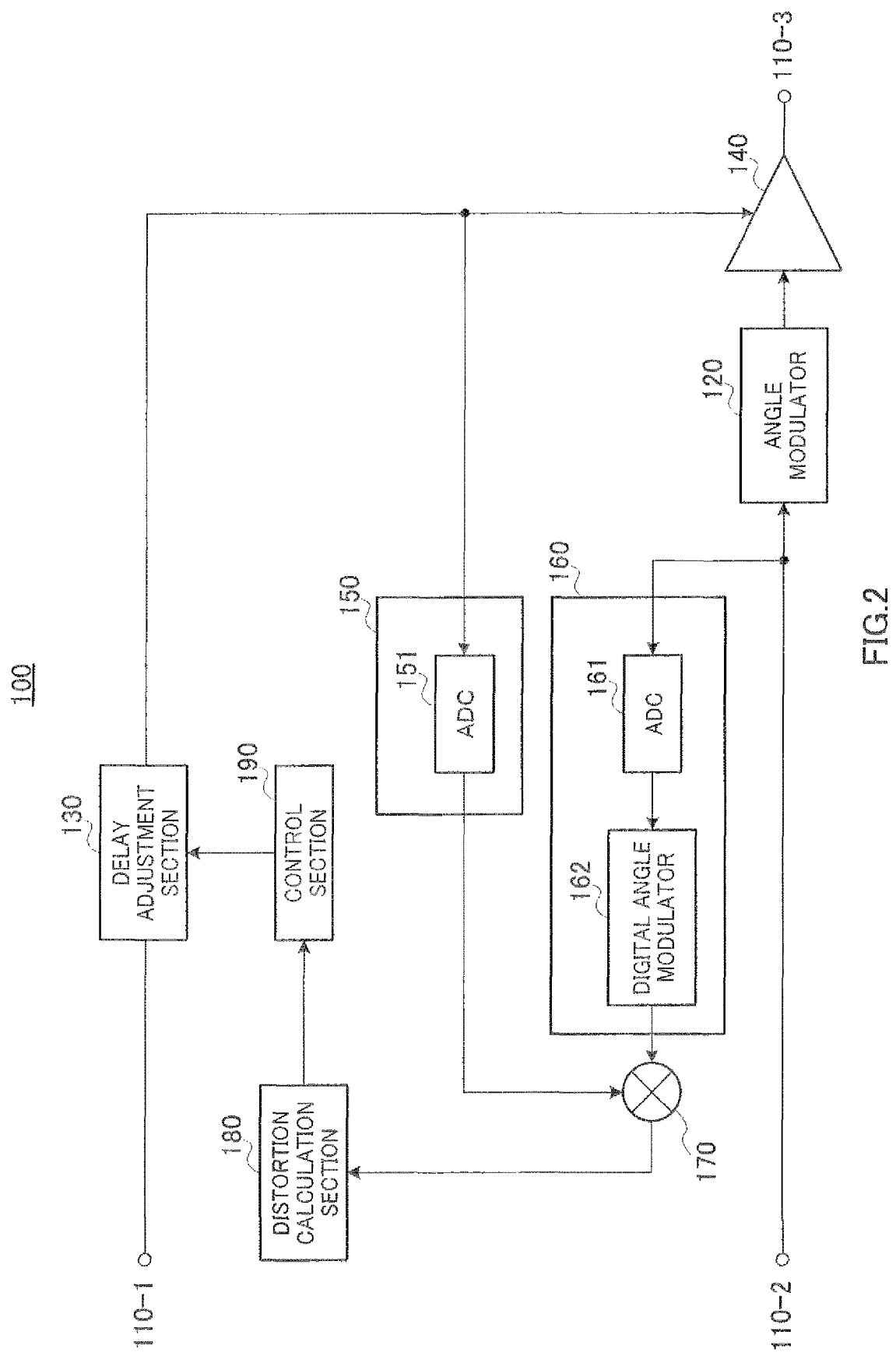
FIG. 2 is a block diagram showing a main configuration of a transmission apparatus according to Embodiment 1 of the present invention.

FIG. 2 is a block diagram showing a main configuration of a transmission apparatus according to the present embodiment. In the transmission apparatus of FIG. 2, an amplitude signal is input from input terminal 110-1 and an angle signal is input from input terminal 110-2. Here, an angle signal is a phase signal or a frequency signal.

Angle modulator 120 receives as input an angle signal of an input signal and angle modulates the angle signal to generate an angle modulated signal, and outputs the angle modulated signal to amplitude modulator 140. An internal configuration of angle modulator 120 will be described later.

Delay adjustment section 130 receives as input an amplitude signal of an input signal, delays the amplitude signal by delay time ordered by control section 190 (described later), and outputs the delayed amplitude signal to a power supply terminal of amplitude modulator 140. Here, current can be supplied to the power supply terminal instead of voltage.

Amplitude modulator 140 amplitude modulates the angle modulated signal using the amplitude signal input from delay adjustment section 130, and outputs the obtained modulated signal in a radio frequency band, from output terminal 110-3. By this means, power of the angle modulated signal is amplified according to an amplitude component of the input signal.

Digital amplitude signal generation section 150 generates a digital amplitude signal by performing analog to digital conversion on the amplitude signal of the input signal. Digital amplitude signal generation section 150 includes analog to digital converter (ADC) 151, and ADC 151 receives an amplitude signal input to the power supply terminal of amplitude modulator 140 and converts that amplitude signal into a digital signal. ADC 151 outputs the digital amplitude signal after conversion to multiplier 170.

Digital angle modulated signal generation section 160 generates, in a pseudo manner, a digital angle modulated signal corresponding to a signal obtained by performing analog to digital conversion on an angle modulated signal.

Digital angle modulated signal generation section 160 includes ADC 161 and digital angle modulator 162.

ADC 161 receives as input the angle signal input to angle modulator 120, converts that angle signal into a digital signal, and outputs the digital angle signal after conversion to digital angle modulator 162.

Digital angle modulator 162 angle modulates the digital angle signal to generate a digital angle modulated signal. Digital angle modulator 162 outputs the digital angle modulated signal to multiplier 170.

Multiplier 170 multiplies the digital amplitude signal by the digital angle modulated signal to generate a modulated signal in a digital domain (hereinafter referred to as "digital modulated signal"). As described above, a digital angle modulated signal, corresponding to a signal obtained by performing analog to digital conversion on the modulated signal generated by amplitude modulator 140, is generated in a pseudo manner. Multiplier 170 outputs the digital modulated signal to distortion calculation section 180.

Distortion calculation section 180 calculates distortion of the digital modulated signal and outputs the obtained distortion to control section 190. A method of calculating distortion in distortion calculation section 180 will be described later.

Control section 190 controls delay time in delay adjustment section 130 so that distortion becomes smaller.

Figure 3:
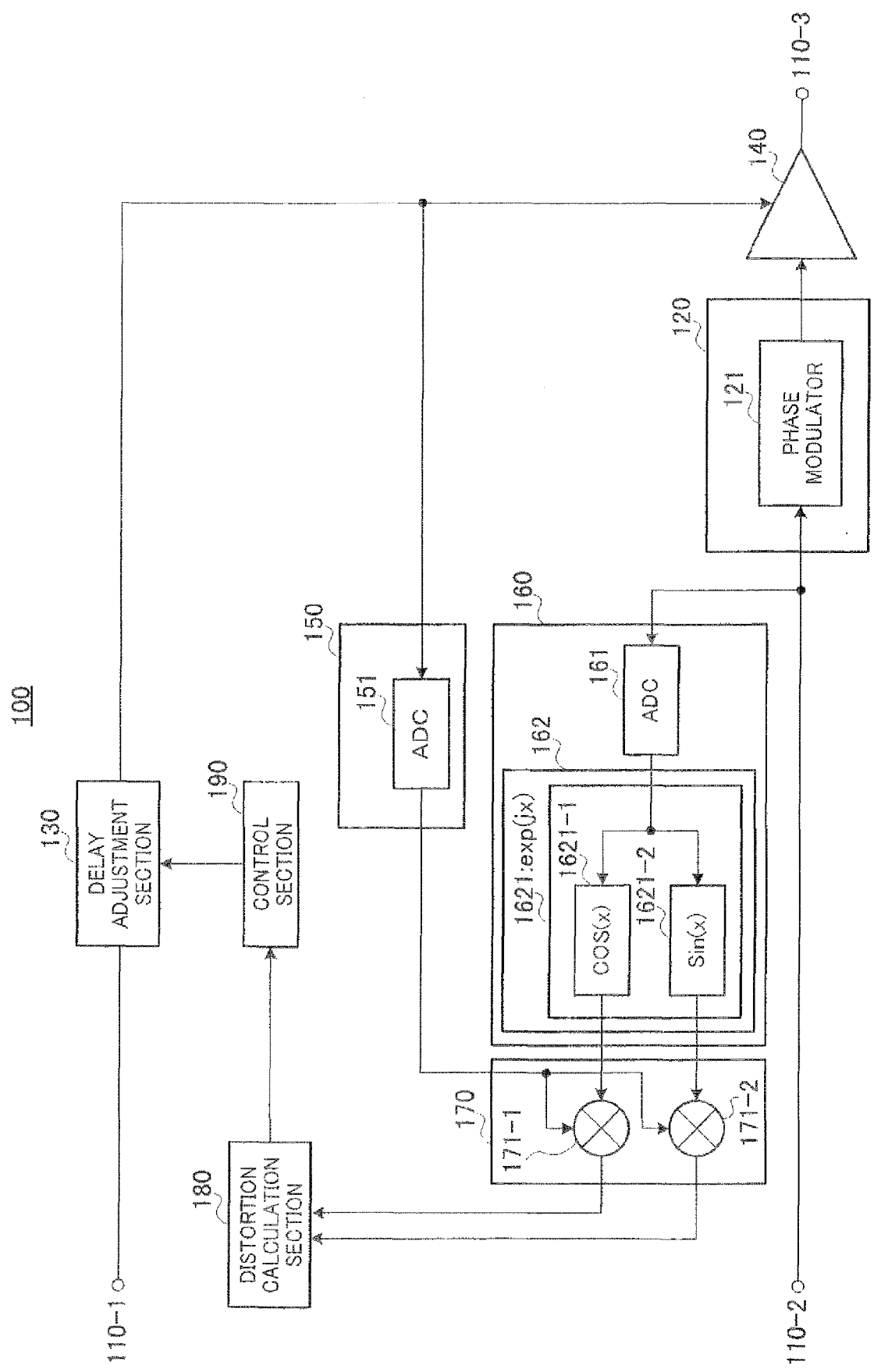
FIG. 3 is a block diagram showing an example of a detailed configuration of a transmission apparatus according to Embodiment 1.

FIG. 3 shows an example of a configuration of angle modulator 120 and digital angle modulated signal generation section 160 when an angle signal input from input terminal 110-2 is a phase signal. In this case, angle modulator 120 is phase modulator 121. Further, digital angle modulator 162 is exp (jx) calculator 1621. Exp (jx) calculator 1621 performs complex number calculation on an input signal x, and outputs exp (jx). Here, when the angle signal is a phase signal, a digital phase signal is input from ADC 161 to digital angle modulator 162.

In exp (jx) calculator 1621, the digital phase signal is divided into a real number portion and an imaginary number portion, which are then input to cos (x) calculator 1621-1 and sin (x) calculator 1621-2, respectively. Then, cos (x) calculator 1621-1 and sin (x) calculator 1621-2 calculate cos (x) and sin (x) of input x, respectively, and outputs the result of the calculation to multipliers 171-1 and 171-2. That is, exp (jx) calculator 1621 generates a digital real number signal and a digital imaginary number signal, as digital angle modulated signals, by performing analog to digital conversion on a phase signal, using a digital phase signal.

Figure 1:
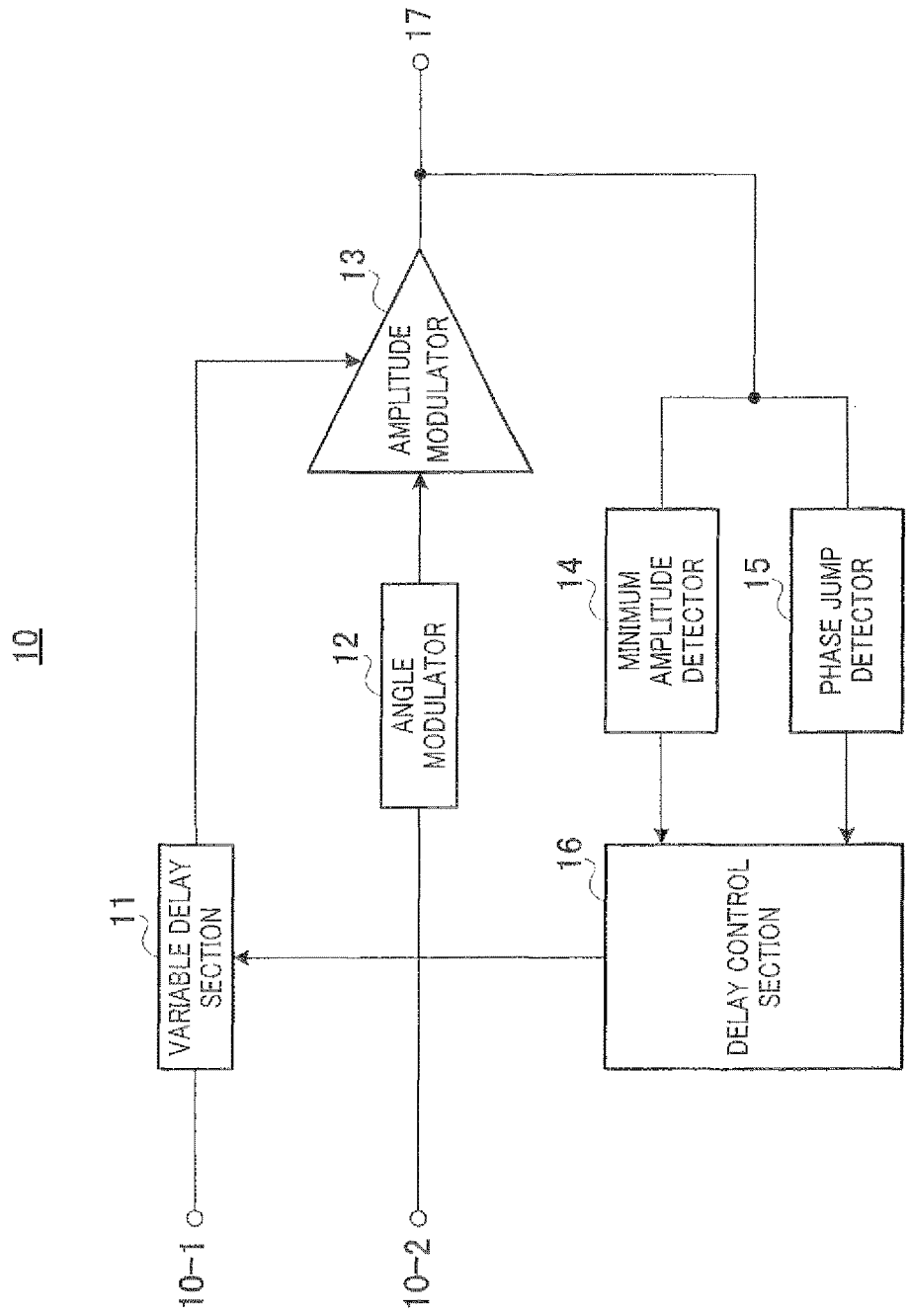
FIG. 1 is a block diagram showing a conventional transmission apparatus.

Multiplier 171-1 multiplies cos (x) by the digital amplitude signal, and then outputs the signal as a real number component of the digital modulated signal, to distortion calculation section 180. Similarly, multiplier 171-2 multiplies sin (x) by the digital amplitude signal, and then outputs the signal as an imaginary number component of the digital modulated signal, to distortion calculation section 180. Multipliers 171-1 and 171-2 in FIG. 3 correspond to multiplier 170 in FIG. 1.

Figure 4:
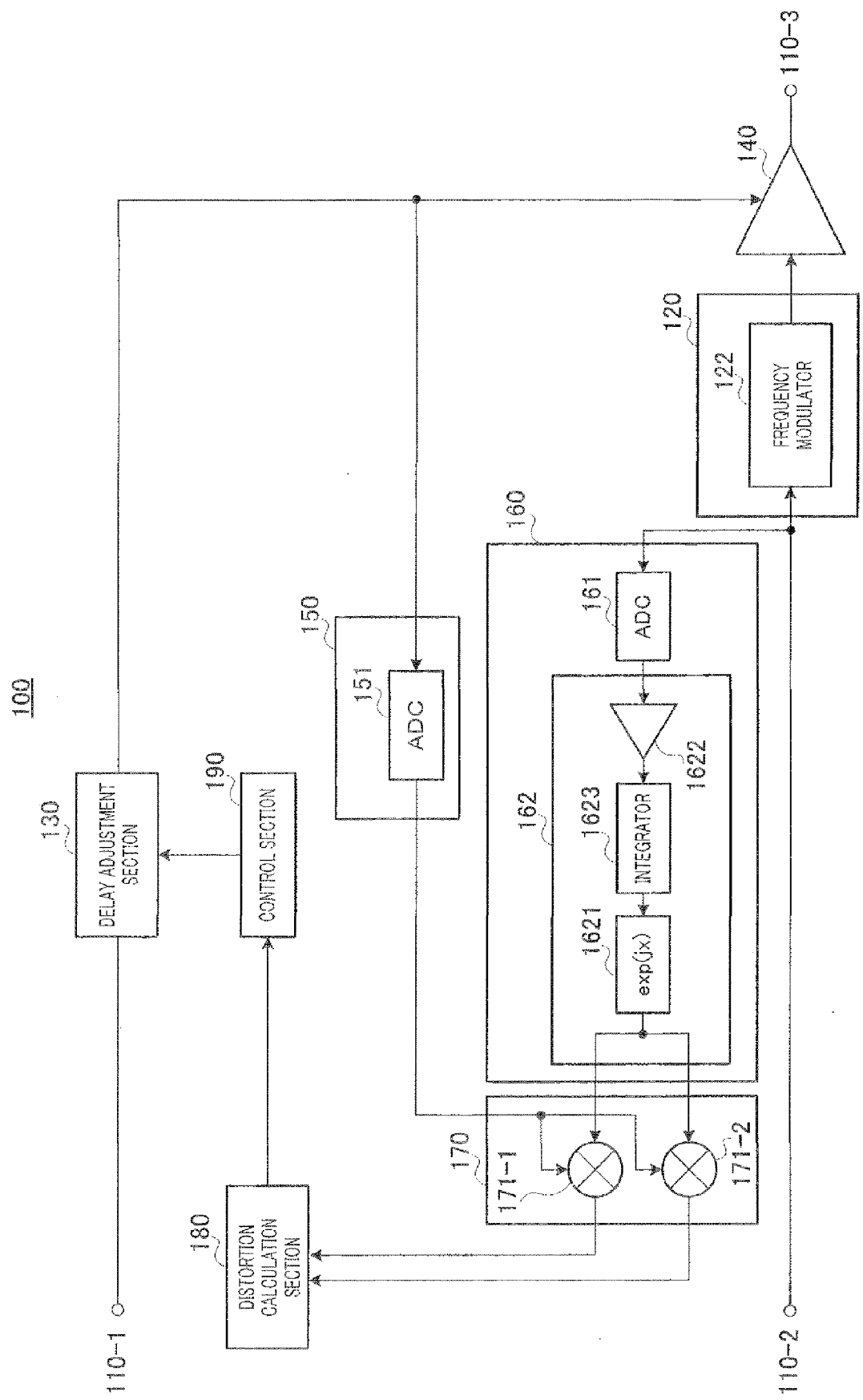
FIG. 4 is a block diagram showing another example of a detailed configuration of a transmission apparatus according to Embodiment 1.

FIG. 4 shows an example of a configuration of angle modulator 120 and digital angle modulated signal generation section 160 when an angle signal input from input terminal 110-2 is a frequency signal. In this case, angle modulator 120 is frequency modulator 122. Further, digital angle modulator 162 includes multiplier 1622, integrator 1623, and exp (jx)

calculator 1621. Here, when the angle signal is a frequency signal, a digital frequency signal is input from ADC 161 to digital angle modulator 162.

Multiplier 1622 adjusts a gain of the digital frequency signal. The gain in multiplier 1622 depends on scaling of a signal input to frequency modulator 122. For example, when the difference of the digital phase signals (calculated by subtracting a phase of the previous sample point from a phase of certain sample point) is input to frequency modulator 122 as a digital frequency signal, the gain in multiplier 1622 is calculated as 1, so that it is possible to omit multiplier 1622.

Integrator 1623 integrates the digital frequency signal after gain adjustment to generate a digital phase component signal, and outputs the generated digital phase component signal to exp (jx) calculator 1621.

Exp (jx) calculator 1621 calculates cos (x) and sin (x) of input x, respectively, and outputs the result of the calculation to multipliers 171-1 and 171-2. That is, exp (jx) calculator 1621 generates a digital real number signal and a digital imaginary number signal, as digital angle modulated signals, by performing analog to digital conversion on a phase signal, using the digital frequency signal.

An operation of transmission apparatus 100 configured as described above will be explained below.

An amplitude signal is input from input terminal 110-1, and an angle signal (i.e. a phase signal or a frequency signal) is input from input terminal 110-2.

The angle signal input from input terminal 110-2 is input to angle modulator 120 and is angle modulated to be generated as an angle modulated signal, and the angle modulated signal is input to amplitude modulator 140. The amplitude signal input from input terminal 110-1 receives delay adjustment in delay adjustment section 130, and is input to the other input terminal (power supply terminal) of amplitude modulator 140.

In amplitude modulator 140, the angle modulated signal input from angle modulator 120 is amplitude modulated with the amplitude signal input from delay adjustment section 130 to be generated as a modulated signal, and the modulated signal is output from output terminal 110-3.

Further, the amplitude signal input to amplitude modulator 140 is converted into a digital signal by ADC 151, and the digital amplitude signal after conversion is input to multiplier 170.

The angle signal input to angle modulator 120 is converted into a digital signal by ADC 161, and the digital angle signal after conversion is output to digital angle modulator 162. The digital angle signal is angle modulated in digital angle modulator 162 to be generated as a digital angle modulated signal, and the digital angle modulated signal after modulation is input to multiplier 170.

In multiplier 170, the digital amplitude signal and the digital amplitude modulated signal are multiplied. By this means, a modulated signal (hereinafter referred to as "digital modulated signal") is generated in a digital domain. This digital modulated signal is almost equivalent to a signal in a baseband domain that is obtained by performing analog to digital conversion on the modulated signal in an analog domain that is output from amplitude modulator 140. As described above, according to the present embodiment, a digital modulated signal that is almost equivalent to the modulated signal output from amplitude modulator 140 is generated in a pseudo manner, and afterwards that digital modulated signal is used to adjust delay in the amplitude path and the angle path.

The digital modulated signal is input to distortion calculation section 180, where distortion of the digital modulated signal is calculated and delay adjustment section 130 is controlled via control section 190 so that distortion becomes smaller.

Then, an operation of distortion calculation section 180 will be explained below.

Distortion calculation section 180 performs Fourier transform on a complex signal, which is a digital modulated signal input from multiplier 170, compares the scales of a desired signal and a distorted signal, and outputs the ratio to control section 190. For example, in the case of the universal mobile telecommunications system (UMTS), distortion calculation section 180 calculates adjacent channel leakage ratio (ACLR) 5, which is leakage power of an adjacent channel of 5 MHz offset, or ACLR 10, which is leakage power of an adjacent channel of 10 MHz offset, and outputs the obtained information about distortion to control section 190.

Here, it is possible to use any methods other than Fourier transform for a calculation method in distortion calculation section 180. For example, distortion calculation section 180 can detect the level of an output signal using a plurality of digital filters corresponding to each frequency.

Then, an operation of control section 190 will be explained below.

Control section 190 controls delay time in delay adjustment section 130 based on the information about distortion output from distortion calculation section 180. Specifically, control section 190 optimizes &clay time in delay adjustment section 130 so that the distortion value output from distortion calculation section 180 becomes a minimum. As an algorithm, the steepest descent method is used, for example.

As described above, according to the present embodiment, transmission apparatus 100 generates a modulated signal in a digital domain in a pseudo manner. Then, control section 190 is configured to adjust delay time in the amplitude path and the angle path based on information about distortion of a modulated signal (pseudo modulated signal) generated in a digital domain in a pseudo manner, instead of the actual modulated signal obtained in amplitude modulator 140.

The digital modulated signal generated in a pseudo manner contains an amplitude signal and an angle modulated signal, and control section 190 controls delay time in delay adjustment section 130 so that the distortion of that digital modulated signal becomes smaller. As described above, because control section 190 does not adjust delay time using a phase signal itself, it is possible to control the difference of time between an amplitude signal and an angle signal to an optimal point even when a phase signal does not pass through the vicinity of the origin.

In this regard, although it is possible to generate a pseudo modulated signal in an analog domain in a pseudo manner, in such a case, analog parts are required, making the circuit size larger. Further, because analog parts consumes large power, and each analog part for generating a pseudo modulated signal shows variation and the characteristics changes depending on the temperature, even when delay between an amplitude path and an angle path is adjusted using a generated pseudo modulated signal, influence of analog parts for generating that pseudo modulated signal will still remain.

On the other hand, as described above, by using a pseudo modulated signal in a digital domain, it is possible to perform calculation processing in distortion calculation section 180 using a digital processing circuit, making it possible to suppress increase of the circuit size and power consumption. Further, because delay time variation does not occur in a digital processing circuit, a pseudo modulated signal in a digital domain will include only influence of delay time between an amplitude path and an angle path in a transmission apparatus.

As described above, according to the present embodiment, digital amplitude signal generation section 150 generates a digital amplitude signal by performing analog to digital conversion on an amplitude signal; digital angle modulated signal generation section 160 generates a digital angle modulated signal corresponding to a signal obtained by performing analog to digital conversion on an angle modulated signal; multiplier 170 multiplies the digital amplitude signal by the digital angle modulated signal to generate, in a pseudo manner, a digital modulated signal corresponding to a signal obtained by performing analog to digital conversion on a modulated signal generated by amplitude modulator 140. Then, distortion calculation section 180 calculates distortion of the digital modulated signal; control section 190 controls delay time based on the distortion of the digital modulated signal; and delay adjustment section 130 adjusts delay time until the amplitude signal is input to amplitude modulator 140, or delay time until the angle modulated signal is input to amplitude modulator 140.

That is, in transmission apparatus 100, an amplitude signal is input to input terminal 110-1 and an angle signal is input to input terminal 110-2; and transmission apparatus 100 is configured to include angle modulator 120 that is connected to the second input terminal 110-2; amplitude modulator 140 that is connected to output of angle modulator 120; ADC 151 that performs AD conversion on the amplitude signal input to amplitude modulator 140 having the other input terminal to which input terminal 110-1 is connected; ADC 161 that performs AD conversion on the signal input to angle modulator 120; digital angle modulator 162 that are connected to output of ADC 161 and performs angle modulation; multiplier 170 that multiplies output of ADC 151 by output of digital angle modulator 162; distortion calculation section 180 that calculates distortion of the signal output from multiplier 170; delay adjustment section 130 that is connected between output of internal terminal 110-1 and the connecting point of input of ADC 151 and input of amplitude modulator 140 or between output of internal terminal 110-2 and the connecting point of input of ADC 161 and input of angle modulator 120; and control section 190 that controls delay time in delay adjustment section 130 based on the result of distortion calculation section 180 so that distortion becomes smaller.

As described above, transmission apparatus 100 generate a modulated signal in a digital domain in a pseudo manner, and adjust delay time in the amplitude path and the angle path based on distortion of the generated digital modulated signal. Therefore, it is possible to realize stable characteristics by suppressing increase of the circuit size and controlling the difference of time between an amplitude signal and a phase signal to an optimal point regardless of characteristics of the phase signal of a modulated signal.

Further, when delay time in angle modulator 120 or the difference of delay time between two paths in amplitude modulator 140 cannot be ignored, it is possible to measure each delay time in advance and add that each delay time after ADC 151 or ADC 161. For example, in the case where the sum of delay time in angle modulator 120 and delay time in which an angle modulated signal is input to and is output from amplitude modulator 140 is defined as d1, delay time in which an amplitude signal is input to and is output from amplitude modulator 140 is defined as d2, and when d1<d2 is satisfied, it is possible to additionally insert a delay section having delay time of (d2−d1) in the output side of ADC 151; and, when d1>d2 is satisfied, it is possible to additionally insert the delay section after ADC 161.

Here, the position in which delay adjustment section 130 is inserted is not limited to the amplitude path, and it is also possible to insert delay adjustment section 130 in the angle signal path. It is possible to provide delay adjustment section 130 anywhere as long as it is in the front stage of the connecting point of ADC 161 and the angle signal path, and, for example, it is possible to provide delay adjustment section 130 immediately after input terminal 110-2.

Further, it is possible to perform delay adjustment in delay adjustment section 130 at a predetermined interval, and for example, in the case of UMTS, it is possible to perform delay adjustment per slot or per frame.

By performing above-described control, it is possible to adjust delay time of an amplitude signal and an angle signal so that the delay time is controlled to an optimal point, making it possible to prevent deterioration of distortion due to lag of delay time.

Embodiment 2

Figure 5:
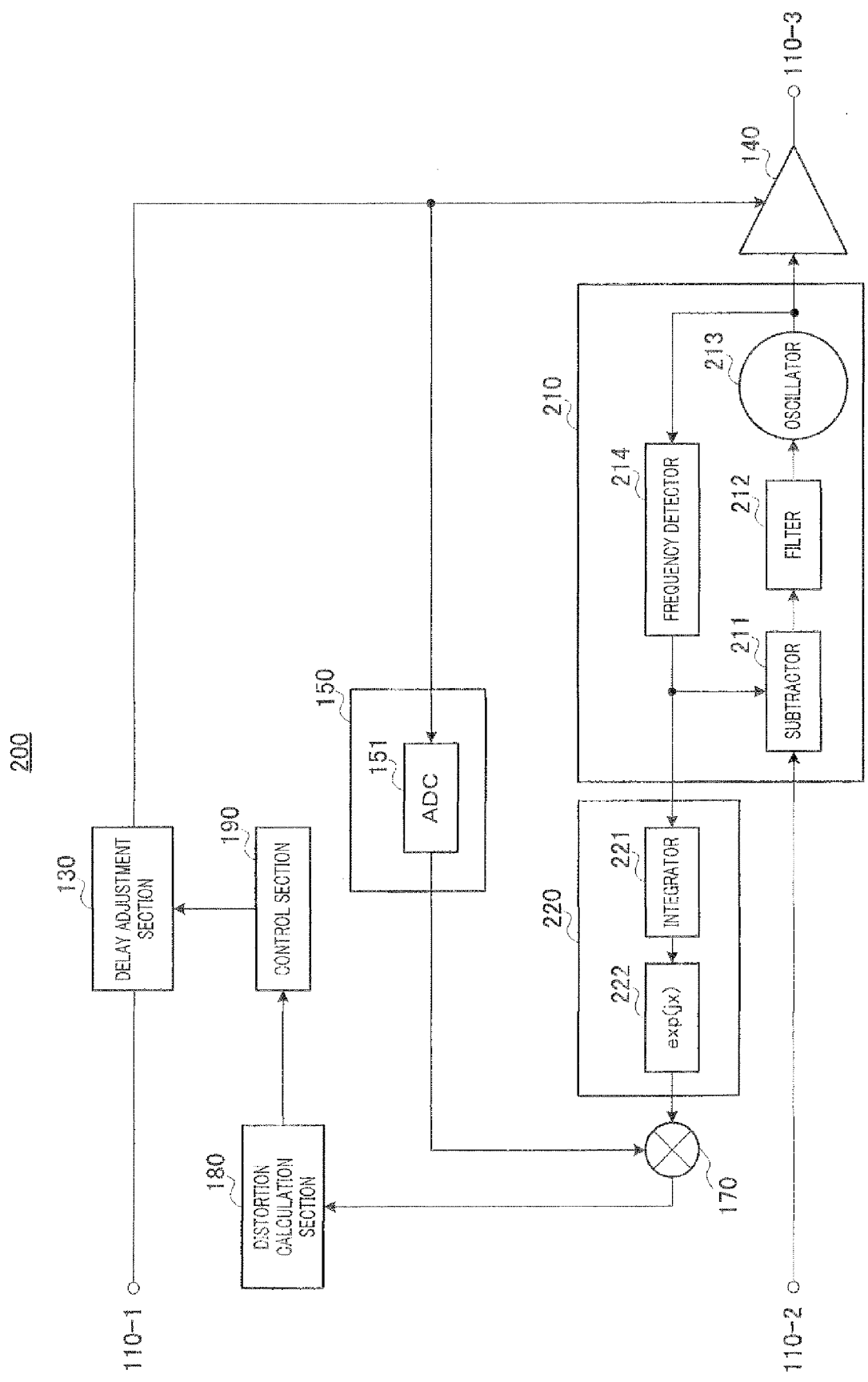
FIG. 5 is a block diagram showing a main configuration of a transmission apparatus according to Embodiment 2 of the present invention.

FIG. 5 is a block diagram showing a main configuration of a transmission apparatus according to the present embodiment. Parts in the transmission apparatus according to the present embodiment in FIG. 5 that are the same as in FIG. 2 will be assigned the same reference numerals as in FIG. 2 and overlapping explanations will be omitted. Compared to transmission apparatus 100 of FIG. 2, transmission apparatus 200 of FIG. 5 is configured to include angle modulator 210 and digital angle modulated signal generation section 220 instead of angle modulator 120 and digital angle modulated signal generation section 160. In transmission apparatus 200 of FIG. 5, an amplitude signal is input from input terminal 110-1 and a frequency signal is input from input terminal 110-2. A case will be described with the present embodiment where the difference of a phase signal is input as a frequency signal.

Angle modulator 210 is a frequency modulator and includes subtractor 211, filter 212, oscillator 213, and frequency detector 214.

Subtractor 211 compares the frequency signal input from input terminal 110-2 and the frequency signal input from frequency detector 214, and outputs that difference to filter 212.

Filter 212 removes an unnecessary component from the difference calculated in subtractor 211, and outputs a difference signal after removal to oscillator 213.

Oscillator 213 generates a high-frequency signal having a frequency corresponding to the difference signal level from filter 212, and outputs the generated high-frequency signal to frequency detector 214 and amplitude modulator 140. By doing so, frequency modulation is performed by oscillator 213. As oscillator 213, a voltage controlled oscillator (VCO) or a digitally controlled oscillator (DCO), for example, is used.

Frequency detector 214 outputs a value corresponding to the frequency of the input high-frequency signal. Here, when a frequency to digital converter (FDC), for example, is used as frequency detector 214, a digital frequency signal can be obtained in frequency detector 214. Frequency detector 214 outputs the digital frequency signal to subtractor 211.

By doing so, because angle modulator 210 is configured to provide a feedback system, it is possible to output a stable signal even when characteristics of oscillator 213 vary.

Digital angle modulated signal generation section 220 includes integrator 221 and exp (jx) calculator 222.

Integrator 221 integrates the digital frequency signal output from frequency detector 214 to generate a digital phase signal. Integrator 221 outputs the generated digital phase signal to exp (jx) calculator 222.

Exp (jx) calculator 222, which is configured in the same way as exp (jx) calculator 1621, calculates cos (x) and sin (x) of input x, respectively, and outputs the result of the calculation to multipliers 171-1 and 171-2 in multiplier 170. In FIG. 5, multiplier 170 is configured in the same way as multiplier 170 in FIGS. 3 and 4.

An operation of a transmission apparatus configured as described above will be explained below.

The amplitude signal input from input terminal 110-1 receives delay adjustment in delay adjustment section 130, and then is input to an input terminal (power supply terminal) of amplitude modulator 140.

On the other hand, the frequency signal input from input terminal 110-2 receives comparison processing in subtractor 211, then receives suppression of an unnecessary signal in filter 212, and is input to oscillator 213. Oscillator 213 outputs a high-frequency signal having a frequency corresponding to the input signal level.

The high-frequency signal output from oscillator 213 is input to frequency detector 214, and frequency detector 214 outputs a value (digital frequency signal) corresponding to the frequency of the input high-frequency signal. The output of frequency detector 214 is input to the other input terminal of subtractor 211, and subtractor 211 outputs the difference between the frequency signal input from input terminal 110-2 and the output of frequency detector 214, to filter 212. Here, when the output of frequency detector 214 contains a DC component, which indicates a center frequency, it is possible to subtract and remove that DC component and then input the output after removal to digital angle modulated signal generation section 220.

Then, a distortion detecting system will be described below.

The amplitude signal input to amplitude modulator 140 is converted into a digital signal by ADC 151, and the digital amplitude modulated signal after conversion is input to multiplier 170. On the other hand, the digital frequency signal output from frequency detector 214 is integrated in integrator 221 and then receives calculation processing in exp (jx) calculator 222, and the result of the calculation is input to multiplier 170. In multiplier 170, the digital amplitude signal and the digital amplitude modulated signal are multiplied to be generated as a digital modulated signal. The digital modulated signal receives calculation of distortion in distortion calculation section 180, and, based on the result of the distortion, control section 190 adjusts the delay time in delay adjustment section 130. The method of controlling delay time in control section 190 is the same as in Embodiment 1, and detailed explanations will be omitted.

As described above, according to the present embodiment, frequency detector 214 operates in the same way as ADC 161 in FIG. 2, and frequency detector 214 can compensate variation of delay of a frequency modulator (angle modulator 210) that is configured with subtractor 211, filter 212, and oscillator 213.

As described above, according to the present embodiment, angle modulator 210 is a frequency modulator; and includes subtractor 211, filter 212 that removes an unnecessary component from the result of comparison in subtractor 211, oscillator 213 that oscillates at a frequency corresponding to the output level of filter 212 and generates a high-frequency signal, and frequency detector 214 that detects the frequency of the high-frequency signal and outputs the result of the detection as a digital frequency signal; and subtractor 211 compares the frequency signal and the digital frequency signal. Digital angle modulated signal generation section 220 includes integrator 221 that integrates the digital frequency signal to generate a digital phase signal, and exp (jx) calculator 222 that performs complex number calculation on the digital phase signal to generate a digital angle modulated signal. By this means, it is possible to adjust delay time of an amplitude signal and a phase signal, preventing deterioration of distortion.

Figure 6:
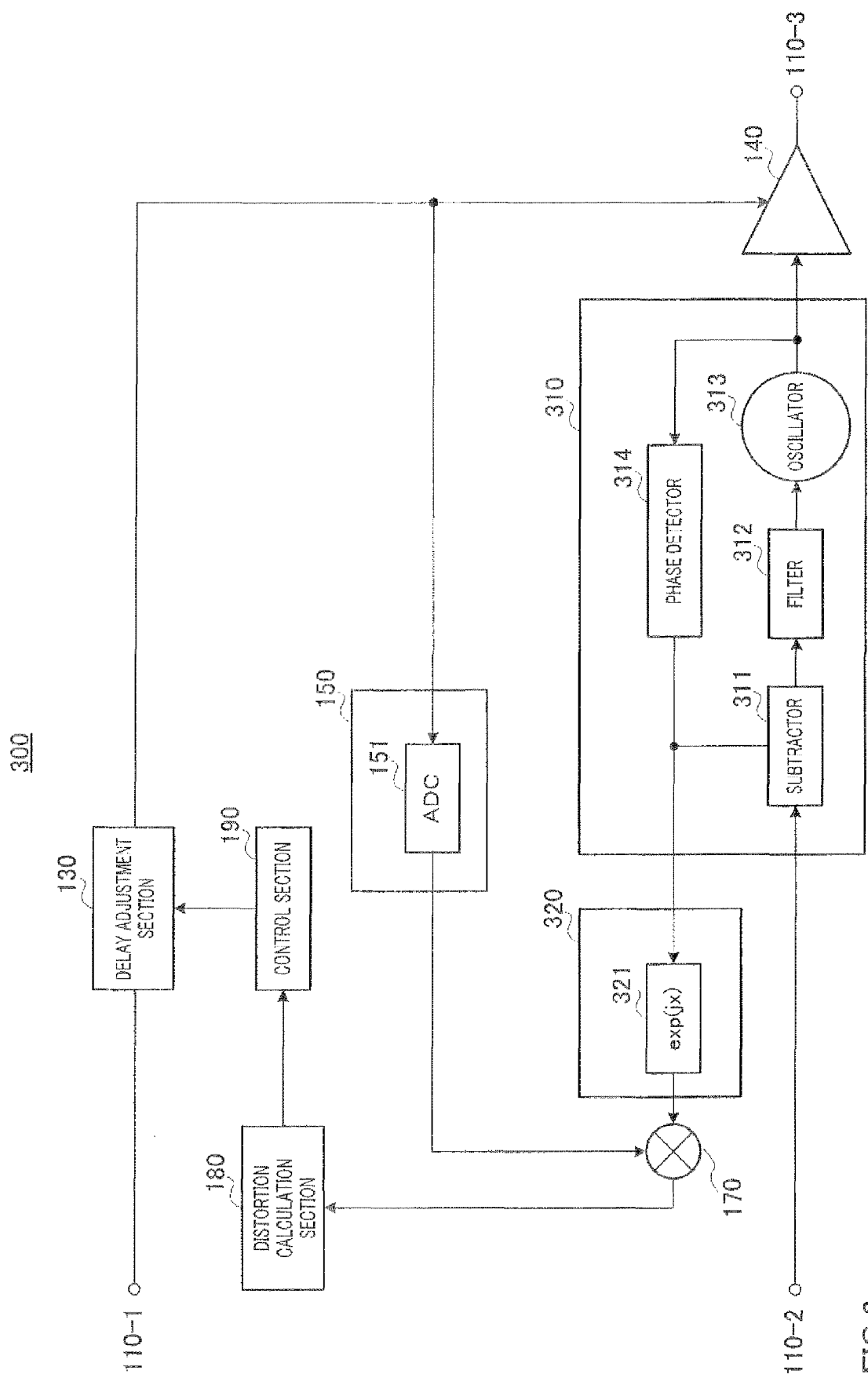
FIG. 6 is a block diagram showing another example of a main configuration of a transmission apparatus according to Embodiment 2.

Here, FIG. 6 is a block diagram showing a main configuration of a transmission apparatus when an input signal of an angle signal is a phase signal. Compared to transmission apparatus 200 of FIG. 5, transmission apparatus 300 of FIG. 6 includes angle modulator 310 and digital angle modulated signal generation section 320 instead of angle modulator 210 and digital angle modulated signal generation section 220. With the configuration of FIG. 6, it is possible to obtain the same effects as the configuration of FIG. 5.

Angle modulator 310 is a phase modulator; and includes subtractor 311, filter 312 that removes an unnecessary component from the result of comparison in subtractor 311, oscillator 313 that oscillates at a frequency corresponding to the output level of filter 312 and generates a high-frequency signal, phase detector 314 that detects a phase of the high-frequency signal and outputs the result of the detection as a digital phase signal; and subtractor 311 compares a phase signal and the digital frequency signal. As described above, with reference to transmission apparatus 200 of FIG. 5, in angle modulator 210, frequency detector 214 detects the frequency of the high-frequency signal generated by oscillator 213 to generate a digital frequency signal; and, in digital angle modulated signal generation section 220, integrator 221 integrates that digital frequency signal to generate a digital phase signal. In contrast to this, with reference to transmission apparatus 300 of FIG. 6, in angle modulator 310, phase detector 314 directly generates a digital phase signal from the high-frequency signal generated by oscillator 313. In transmission apparatus 300, because a digital phase signal is detected from a high-frequency signal, it is not necessary to provide an integrator in the front stage of exp (jx) calculator 321.

Here, the position in which delay adjustment section 130 is inserted is not limited to the amplitude path, and it is also possible to insert delay adjustment section 130 in the phase signal path or the frequency signal path. For example, it is possible to provide delay adjustment section 130 in the front stages of subtractors 211 and 311 in FIG. 5 and FIG. 6.

Further, in the case where there is a difference of delay time between two paths in amplitude modulator 140, as is the case with Embodiment 1, it is possible to additionally insert a delay adjustment section between ADC 151 and multiplier 170 or in the front stage or the rear stage of exp (jx) calculators 222 and 321.

Embodiment 3

Figure 7:
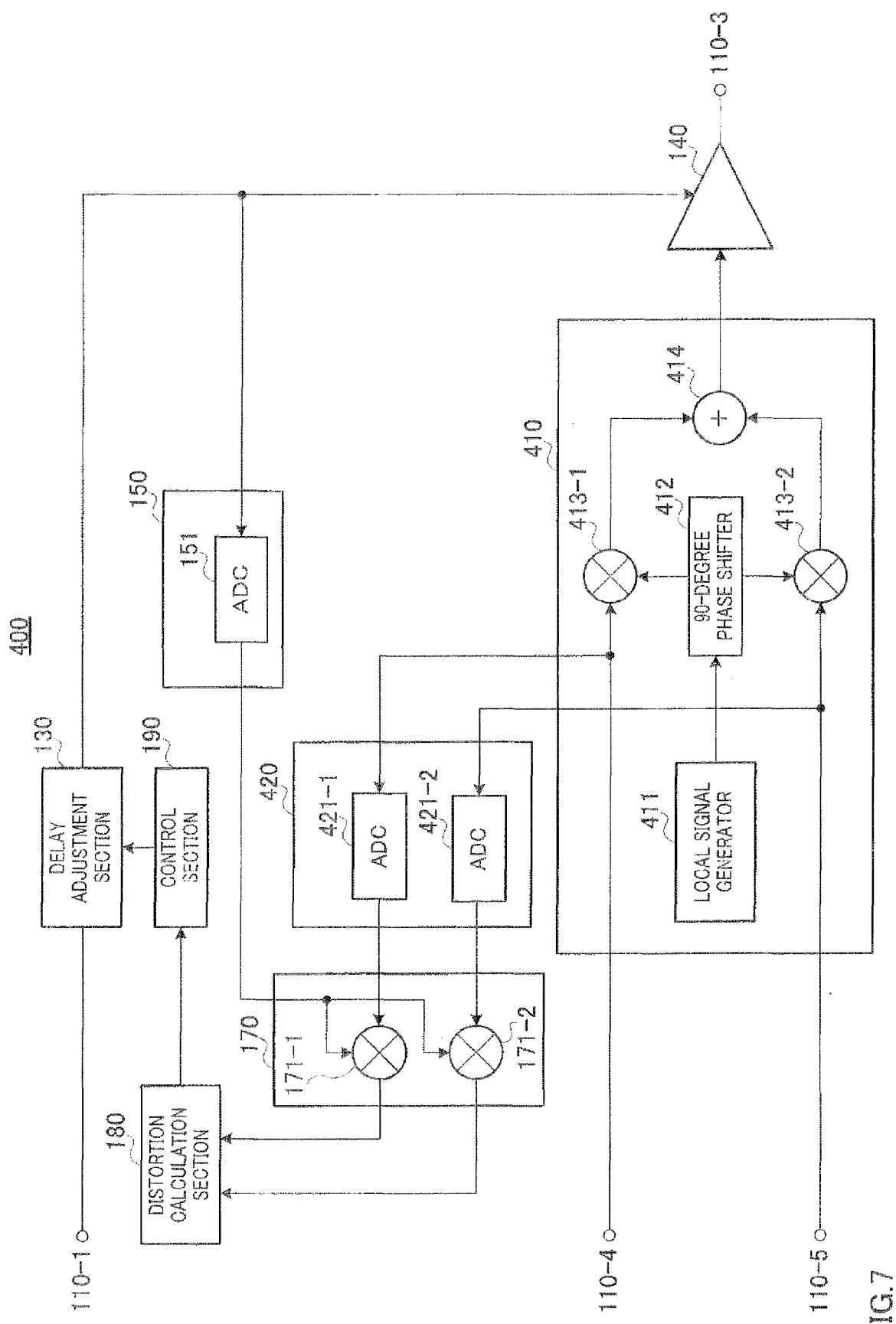
FIG. 7 is a block diagram showing a main configuration of a transmission apparatus according to Embodiment 3 of the present invention.

FIG. 7 is a block diagram showing a main configuration of a transmission apparatus according to the present embodiment. Parts in the transmission apparatus according to the present embodiment in FIG. 7 that are the same as in FIG. 2 will be assigned the same reference numerals as in FIG. 2 and overlapping explanations will be omitted. Compared to transmission apparatus 100 of FIG. 2, transmission apparatus 400 of FIG. 7 includes angle modulator 410 and digital angle modulated signal generation section 420 instead of angle modulator 120 and digital angle modulated signal generation section 160.

In transmission apparatus 400 of FIG. 7, an amplitude signal is input from input terminal 110-1 and an I signal and a Q signal, each having the normalized amplitude, are input from input terminals 110-4 and 110-5. When an angle of the vector formed by IQ is defined as θ, the I signal having the normalized amplitude is cos θ and the Q signal having the normalized amplitude is sin θ.

Angle modulator 410 is a quadrature modulator that includes local signal generator 411, 90-degree phase shifter 412, mixers 413-1 and 413-2, and adder 414.

Local signal generator 411, which is configured, for example, by a phase locked loop (PLL), generates a local signal and outputs the local signal to 90-degree phase shifter 412.

Ninety-degree phase shifter 412 outputs signals in which phases are shifted by 90 degrees from each other, to mixers 413-1 and 413-2.

Mixer 413-1 receives as input the I signal (in-phase signal) having the normalized amplitude from input terminal 110-4, and the local signal from 90-degree phase shifter 412, multiplies these signals, and outputs the result of the multiplication to adder 414.

Mixer 413-2 receives as input the Q signal (quadrature signal) having the normalized amplitude from input terminal 110-5, and the local signal from 90-degree phase shifter 412, multiplies these signals, and output the result of the multiplication to adder 414. Here, the local signals input to mixers 413-1 and 413-2 have the relationship in which phases are shifted from each other by 90 degrees by 90-degree phase shifter 412.

Adder 414 adds output of mixer 413-1 to output of mixer 413-2, and outputs the result of the addition to amplitude modulator 140.

Digital angle modulated signal generation section 420 includes ADCs 421-1 and 421-2.

ADC 421-1 converts the I signal (in-phase signal) having the normalized amplitude into a digital signal to generate a digital in-phase signal, and outputs the digital in-phase signal to multiplier 171-1 in multiplier 170.

ADC 421-2 converts the Q signal (quadrature signal) having the normalized amplitude into a digital signal to generate a digital quadrature signal, and outputs the digital quadrature signal to multiplier 171-2 in multiplier 170.

Multiplier 171-1 multiplies a digital amplitude signal by the digital in-phase signal to generate a real number component signal in a digital domain (hereinafter referred to as "digital real number component signal"), in a pseudo manner. Multiplier 171-1 outputs the digital real number component signal to distortion calculation section 180.

Multiplier 171-2 multiplies a digital amplitude signal by the digital quadrature signal to generate an imaginary number component signal in a digital domain (hereinafter referred to as "digital imaginary number component signal"), in a pseudo manner. Multiplier 171-2 outputs the digital imaginary number component signal to distortion calculation section 180.

An operation of transmission apparatus 400 configured as described above will be explained below.

An amplitude signal is input from input terminal 110-1 and an I signal and a Q signal, each having the normalized amplitude, are input from input terminals 110-4 and 110-5. When an angle of the vector formed by I and Q is defined as θ, the I signal having the normalized amplitude is cos θ and the Q signal having the normalized amplitude is sin θ. The amplitude signal input from input terminal 110-1 receives adjustment of delay time in delay adjustment section 130, and then is input to amplitude modulator 140.

On the other hand, the I signal having the normalized amplitude, which is input to input terminal 110-4, is input to mixer 413-1. Further, the Q signal having the normalized amplitude, which is input to input terminal 110-5, is input to mixer 413-2. A local signal generated in local signal generator 411 is input to mixers 413-1 and 413-2 via 90-degree phase shifter 412. Here, the signals input to mixers 413-1 and 413-2 have the relationship in which the phases are shifted by 90 degrees from each other by 90-degree phase shifter 412. Outputs of mixers 413-1 and 413-2 are combined in adder 414, and then are input to the other input terminal of amplitude modulator 140. As described above, local signal generator 411, 90-degree phase shifter 412, mixers 413-1 and 413-2, and adder 414 form an angle modulator.

In amplitude modulator 140, the angle modulated signal input from angle modulator 410 is amplitude modulated by the amplitude signal input from delay adjustment section 130 to be generated as a modulated signal, and the modulated signal is output from output terminal 110-3.

Then, a delay time compensation system will be described below.

An I signal and a Q signal, each having the normalized amplitude, which are input to mixers 413-1 and 413-2, are converted into digital signals in ADCs 421-1 and 421-2, respectively. Outputs of ADCs 421-1 and 421-2 (a digital I signal and a digital Q signal) are input to multipliers 171-1 and 171-2, respectively.

On the other hand, an amplitude signal input to amplitude modulator 140 is converted into a digital value in ADC 151, and input to the other input terminals of multipliers 171-1 and 171-2.

In multipliers 171-1 and 171-2, the digital amplitude signal is multiplied by the digital I signal and the digital Q signal to generate a digital I modulated signal and a digital Q modulated signal. As described above, outputs of multipliers 171-1 and 171-2 are input to distortion calculation section 180 as a real number component and an imaginary number component of the digital modulated signal. The result of the distortion in distortion calculation section 180 is output to control section 190, and control section 190 controls delay time in delay adjustment section 130. Operations of distortion calculation section 180 and control section 190 are the same as in Embodiment 1 and Embodiment 2, and detailed explanations will be omitted.

As described above, angle modulator 410 is a quadrature modulator, and angle modulator 410 receives as input an in-phase signal and a quadrature signal, each being normalized, as angle signals, to generate an angle modulated signal; and digital angle modulated signal generation section 420 is configured to include the first ADC 421-1 that performs analog to digital conversion on the normalized in-phase signal, as a digital angle modulated signal, to generate a digital in-phase signal, and the second ADC 421-2 that performs analog to digital conversion on the normalized quadrature signal to generate a digital quadrature signal. Multiplier 170 is configured to include the first multiplier 171-1 that multiplies a digital amplitude signal by the digital in-phase signal to generate an in-phase component of a digital modulated signal and the second multiplier 171-2 that multiplies a digital amplitude signal by the digital quadrature signal to generate a quadrature component of the digital modulated signal. Distortion calculation section 180 is configured to calculate distortion using the in-phase component and the quadrature component of the digital modulated signal. By this means, it is possible to adjust delay time of the amplitude signal and the phase signal, making it possible to prevent deterioration of distortion.

Here, the position in which delay adjustment section 130 is inserted is not limited to the amplitude path, and it is also possible to insert delay adjustment section 130 in the phase signal path. For example, in FIG. 7, it is possible to provide delay adjustment section 130 after input terminals 110-4 and 110-5.

Further, in the case where there is a difference of delay time between two paths in amplitude modulator 140, it is possible to insert the corresponding difference of delay time after ADC 151 or after ADCs 421-1 and 421-2.

Embodiment 4

Cases have been described with Embodiment Embodiment 3 where a digital modulated signal is generated in a baseband domain. A case will be described with the present embodiment where a digital modulated signal is generated in a radio frequency domain.

Figure 8:
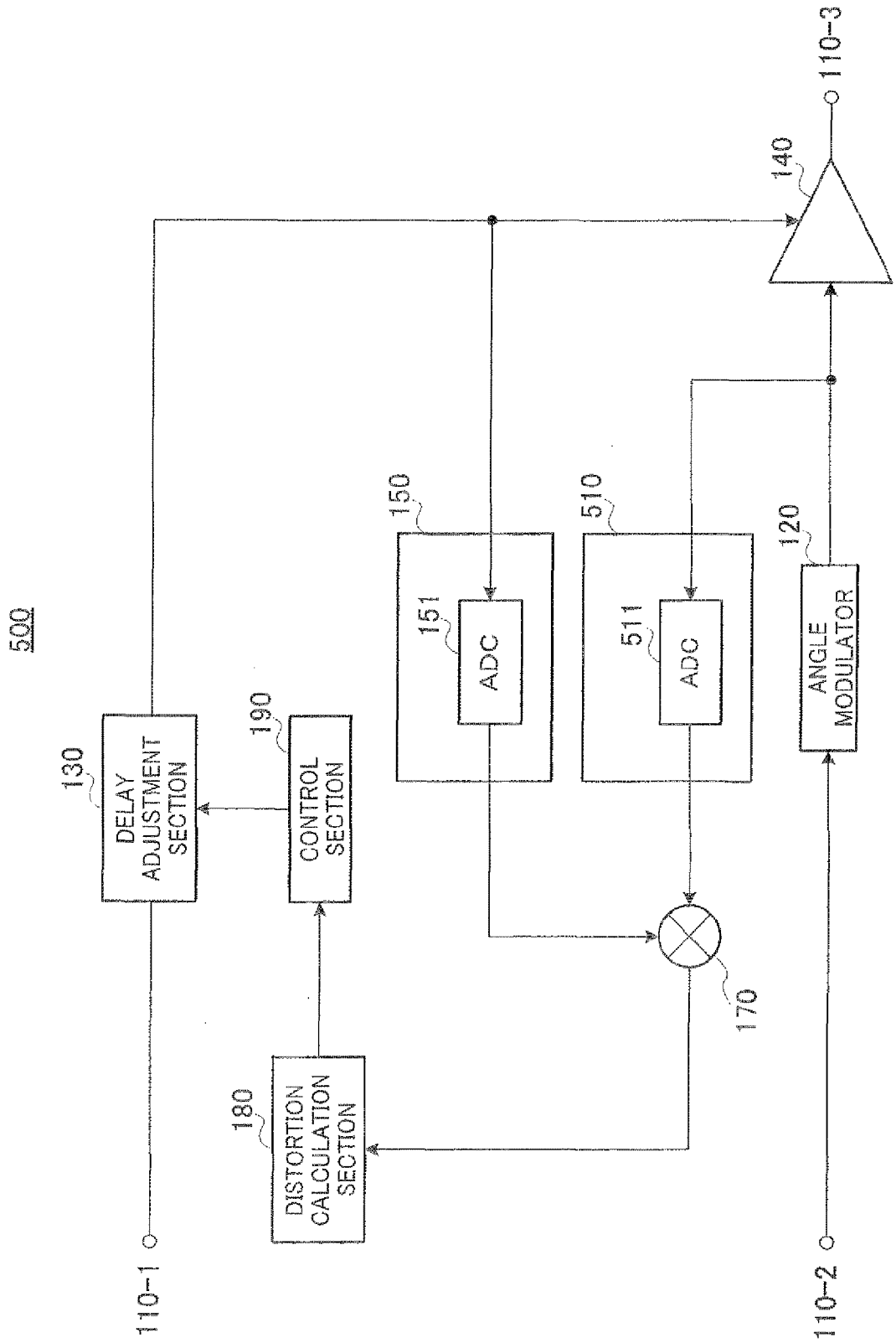
FIG. 8 is a block diagram showing a main configuration of a transmission apparatus according to Embodiment 4 of the present invention.

FIG. 8 is a block diagram showing a main configuration of a transmission apparatus according to the present embodiment. Here, parts in the transmission apparatus of FIG. 8 according to the present embodiment that are the same as in FIG. 2 will be assigned the same reference numerals as in FIG. 2 and overlapping explanations will be omitted. Compared to transmission apparatus 100 of FIG. 2, transmission apparatus 500 of FIG. 8 is configured to include digital angle modulated signal generation section 510 instead of digital angle modulated signal generation section 160.

Digital angle modulated signal generation section 510 is configured to remove digital angle modulator 162 from digital angle modulated signal generation section 160. That is, digital angle modulated signal generation section 510 is configured with ADC 511. Then, digital angle modulated signal generation section 510 generates a digital angle modulated signal in a radio frequency domain by performing analog to digital conversion on an angle modulated signal in a radio frequency domain.

Therefore, multiplier 170 after digital angle modulated signal generation section 510 generates a digital modulated signal in a radio frequency domain by multiplying a digital amplitude modulated signal in a baseband domain by a digital angle modulated signal in a radio frequency domain.

An operation of transmission apparatus 500 configured as described above will be explained below.

An amplitude signal is input from input terminal 110-1, and an angle signal (i.e. a phase signal or a frequency signal) is input from input terminal 110-2. The amplitude signal input from input terminal 110-1 receives delay adjustment in delay adjustment section 130, and is input to the other input terminal (power supply terminal) of amplitude modulator 140.

On the other hand, the angle signal input from input terminal 110-2 is angle modulated in angle modulator 120, and is input to the other input terminal of amplitude modulator 140.

In amplitude modulator 140, the angle modulated signal input from angle modulator 120 is amplitude modulated by the amplitude signal input from delay adjustment section 130 to be generated as a modulated signal, and the modulated signal is output from output terminal 110-3.

Then, the delay time compensation system will be described below.

An amplitude signal input to amplitude modulator 140 is converted into a digital signal by ADC 151 and the digital amplitude signal after conversion is output to multiplier 170. On the other hand, an angle modulated signal input to amplitude modulator 140 is converted into a digital signal by ADC 511 and the digital angle modulated signal after conversion is output to multiplier 170.

In multiplier 170, the digital amplitude signal output from ADC 151 and the digital angle modulated signal output from ADC 511 are multiplied. By this means, a digital modulated signal in a digital domain is generated. The digital modulated signal is input to distortion calculation section 180, the result of the calculation in distortion calculation section 180 is output to control section 190, and control section 190 controls delay time in delay adjustment section 130. Operations of distortion calculation section 180 and control section 190 are the same as in Embodiment 1 to Embodiment 3, and detailed explanations will be omitted.

As described above, according to the present embodiment, digital angle modulated signal generation section 510 is configured to include ADC 511 that generates a digital angle modulated signal in a radio frequency domain by performing analog to digital conversion on an angle modulated signal in a radio frequency domain that is generated by angle modulator 120; and multiplier 170 generates a digital modulated signal by multiplying a digital amplitude signal by the digital angle modulated signal in a radio frequency domain. As described above, transmission apparatus 500 adjusts delay time of an amplitude signal and an angle modulated signal using digital processing, making it possible to suppress increase of the circuit size and prevent deterioration of distortion.

Here, the position in which delay adjustment section 130 is inserted is not limited to the amplitude path, and it is also possible to insert delay adjustment section 130 in the phase signal path or the frequency signal path. For example, it is possible to provide delay adjustment section 130 after input terminal 110-2 or angle modulator 120.

Figure 9:
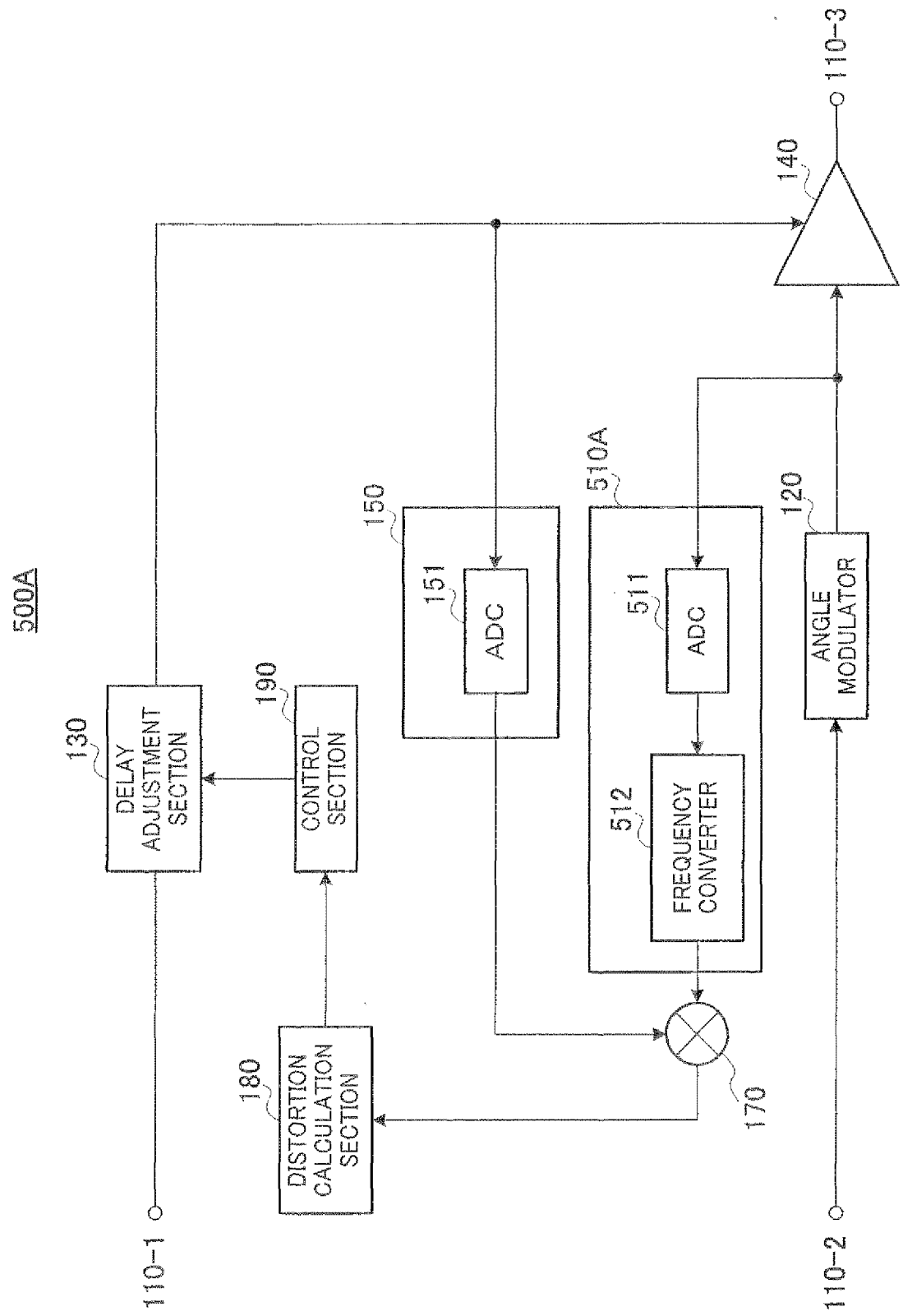
FIG. 9 is a block diagram showing another example of main configuration of a transmission apparatus according to Embodiment 4.
Figure 10:
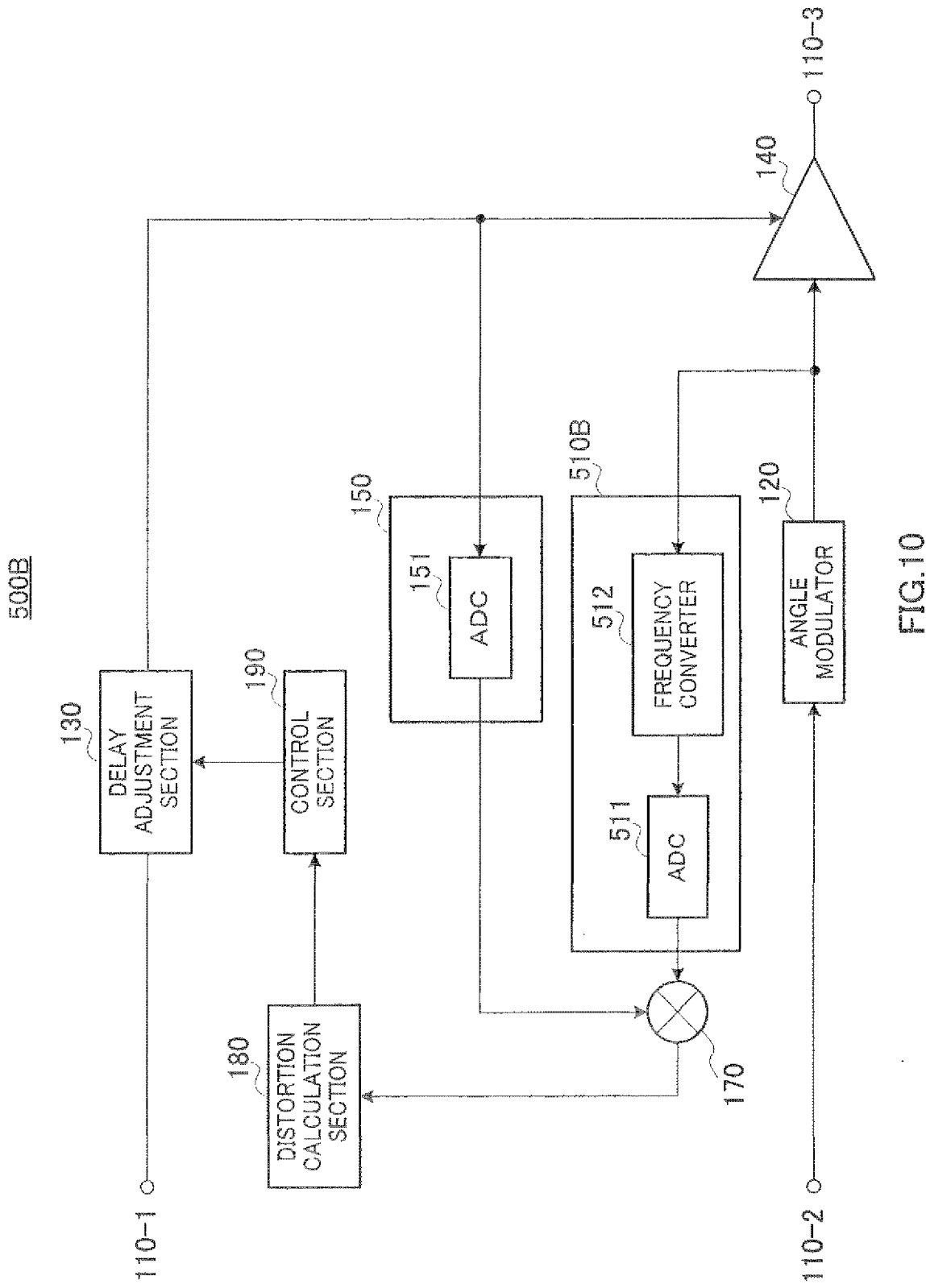
FIG. 10 is a block diagram showing yet another example of a main configuration of a transmission apparatus according to Embodiment 4.
Figure 11:
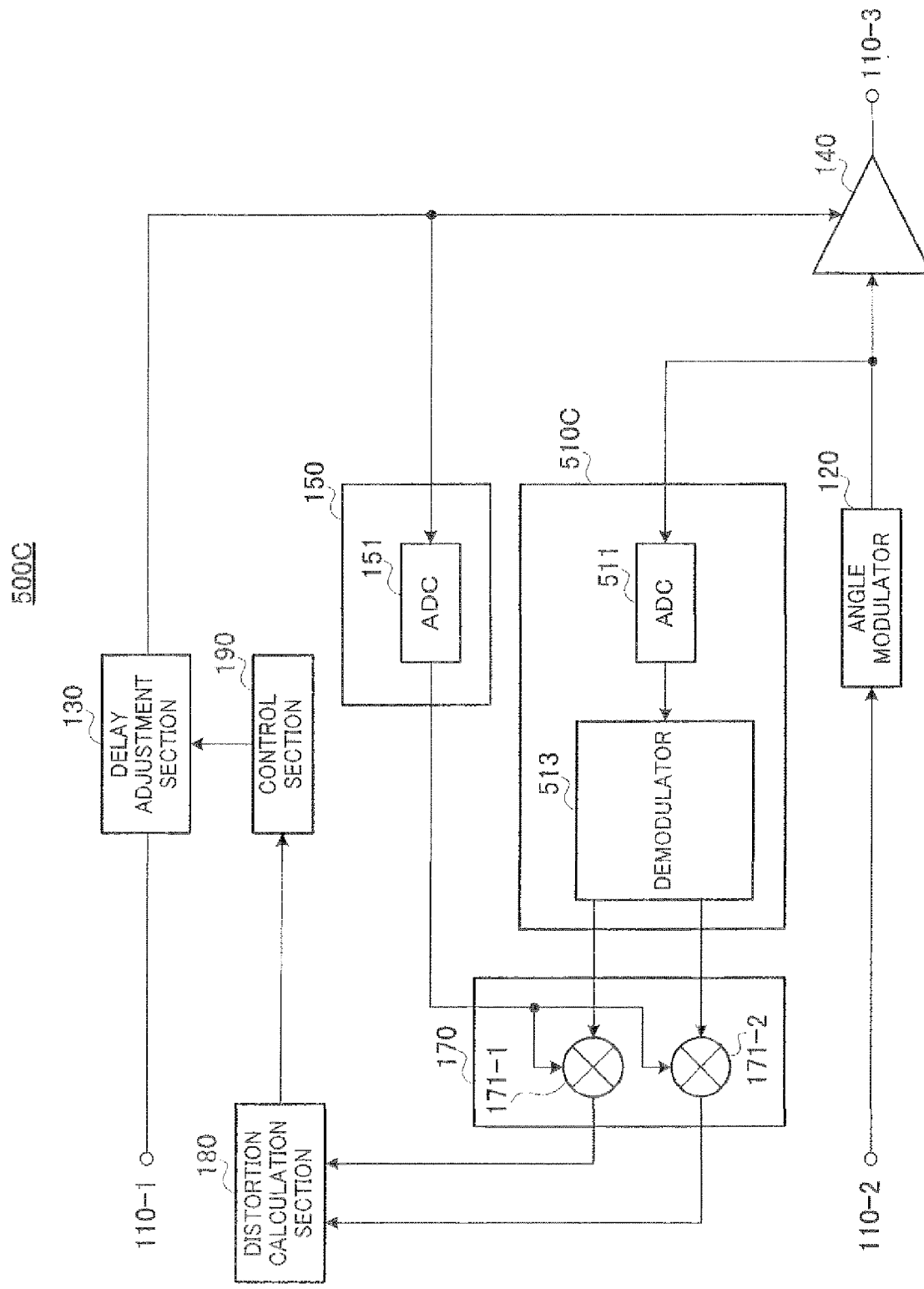
FIG. 11 is a block diagram showing yet another example of a main configuration of a transmission apparatus according to Embodiment 4.

FIGS. 9 to 11 are different block diagrams showing examples of a transmission apparatus according to the present embodiment.

Transmission apparatus 500A shown in FIG. 9 includes frequency converter 512 after ADC 511. Frequency converter 512 down-converts a digital angle modulated signal in a radio frequency domain to lower the frequency of the digital angle modulated signal. By this means, it is possible to reduce the operational clock of digital signal processing sections that are provided in the rear stage, such as distortion calculation section 180. As is the case with transmission apparatus 500B shown in FIG. 10, it is possible to provide frequency converter 512 in the front stage of ADC 511 to perform down-conversion on an angle modulated signal in a radio frequency domain before performing analog to digital conversion. Further, as is the case with transmission apparatus 500C shown in FIG. 11, it is possible to configure digital angle modulated signal generation section 510C using demodulator 513 instead of frequency converter 512, to demodulate a digital I signal and a digital Q signal. Further, in FIG. 11, it is possible to provide frequency converter 512 in the front stage of ADC 511 to perform down-conversion.

Embodiment 5

A transmission apparatus has been described with Embodiment 1 to Embodiment 4. A radio communication apparatus including each transmission apparatus according to Embodiment 1 to Embodiment 4 will be described with the present embodiment.

Figure 12:
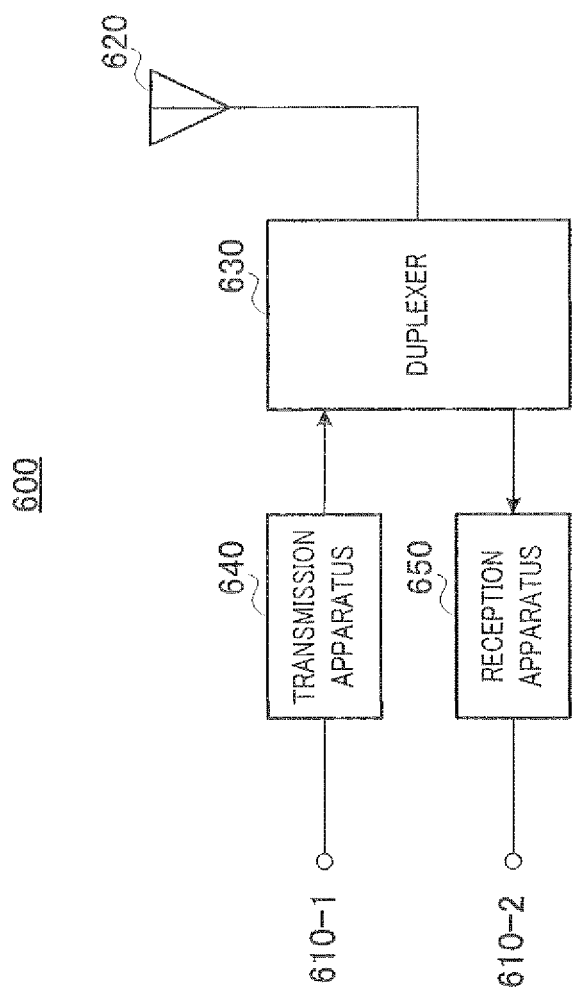
FIG. 12 is a block diagram showing a main configuration of a radio communication apparatus according to Embodiment 5 of the present invention.

FIG. 12 is a block diagram showing radio communication apparatus 600 according to the present embodiment.

Radio communication apparatus 600 includes antenna 620, duplexer 630, transmission apparatus 640, and reception apparatus 650. In FIG. 12, each transmission apparatus described in Embodiment 1 to Embodiment 4 is applied to transmission apparatus 640.

Transmission data is input from input terminal 610-1, and is modulated and converted into a high-frequency signal by transmission apparatus 640. Output of transmission apparatus 640 is radiated from antenna 620 via duplexer 630. On the other hand, the reception signal input from antenna 620 is input to reception apparatus 650 via duplexer 630. Duplexer 630 is a block for discriminating transmission and reception, and is configured with a switch or a filter using an inductor or a SAW device. Reception apparatus 650 demodulates the received signal and outputs the reception data from output terminal 610-2. By applying each transmission apparatus described in Embodiment 1 to Embodiment 4 as transmission apparatus 640, radio communication apparatus 600 can realize transmission with low distortion.

The disclosure of Japanese Patent Application No. 2010-006909, filed on Jan. 15, 2010, including the specification, drawings and abstract, is incorporated herein by reference in its entirety.

INDUSTRIAL APPLICABILITY

A transmission apparatus, a radio communication apparatus, and a transmission method according to the present invention are useful as radio devices such as a mobile phone and a wireless LAN.

REFERENCE SIGNS LIST

100, 200, 300, 400, 500, 500A, 500B, 500C, 640 Transmission apparatus
110-1, 110-2, 110-4, 110-5, 610-1 Input terminal
110-3, 610-2 Output terminal
120, 210, 310, 410 Angle modulator
121 Phase modulator
122, 512 Frequency converter
130 Delay adjustment section
140 Amplitude modulator
150 Digital amplitude signal generation section
151, 161, 421-1, 421-2, 511 ADC
160, 220, 320, 420, 510, 510A, 510B, 510C Digital angle modulated signal generation section
162 Digital angle modulator
1622, 170, 171-1, 171-2 Multiplier
1621, 222, 321 exp (jx) calculator
1623, 221 Integrator
1621-1 cos (x) calculator
1621-2 sin (x) calculator
180 Distortion calculation section
190 Control section
211, 311 Subtractor
212, 312 Filter
213, 313 Oscillator
214 Frequency detector
222 exp (jx) calculator
314 Phase detector
411 Local signal generator
412 90-degree phase shifter
413-1, 413-2 Mixer
414 Adder
513 Demodulator
600 Radio communication apparatus
620 Antenna
630 Duplexer
650 Reception apparatus

The invention claimed is:

1. A transmission apparatus comprising:
an angle modulation section that generates an angle modulated signal in a radio frequency domain using an angle signal of an input signal;
an amplitude modulator that generates a modulated signal by amplifying power of the angle modulated signal according to an amplitude signal of the input signal;
a first generation section that generates a digital amplitude signal by performing analog to digital conversion on the amplitude signal;
a second generation section that generates a digital angle modulated signal corresponding to a signal obtained by performing analog to digital conversion on the angle modulated signal;
a multiplier that generates, in a pseudo manner, a digital modulated signal corresponding to a signal that is obtained by performing analog to digital conversion on the modulated signal, by multiplying the digital amplitude signal by the digital angle modulated signal;
a distortion calculation section that calculates distortion of the digital modulated signal;
an adjustment section that adjusts delay time until the amplitude signal is input to the amplitude modulator, or delay time until the angle modulated signal is input to the amplitude modulator; and
a control section that controls the delay time based on the distortion,
wherein:
the second generation section comprises:
an analog to digital converter that generates a digital angle signal by performing analog to digital conversion on the angle signal; and
a digital angle modulation section that generates the digital angle modulated signal in a baseband domain based on the digital angle signal,
wherein:
the angle signal is a phase signal;
the digital angle signal is a digital phase signal that is obtained by performing analog to digital conversion on the phase signal;
the angle modulation section is a phase modulator;
the digital angle modulation section comprises a complex number calculation section that generates a digital real number signal and a digital imaginary number signal that are obtained by performing analog to digital conversion on a real number component and an imaginary number component of the phase signal using the digital phase signal, as the digital angle modulated signals; and
the multiplier comprises:
a first multiplier that generates a real number component of the digital modulated signal by multiplying the digital amplitude signal by the digital real number signal; and
a second multiplier that generates an imaginary number component of the digital modulated signal by multiplying the digital amplitude signal by the digital imaginary number signal; wherein:
the distortion calculation section calculates the distortion using the real number component and the imaginary number component of the digital modulated signal.

2. A radio communication apparatus comprising:
an antenna;
the transmission apparatus according to claim 1:
a reception apparatus; and
an antenna duplexer for sharing the antenna in the transmission apparatus and the reception apparatus.

3. The transmission apparatus according to claim 1, wherein the control section controls the delay time so that the distortion signal level becomes smaller.

4. The transmission apparatus according to claim 1, wherein the first generation section comprises an analog to digital converter that generates the digital amplitude signal by performing analog to digital conversion on the amplitude signal.

5. A transmission apparatus comprising:
an angle modulation section that generates an angle modulated signal in a radio frequency domain using an angle signal of an input signal;
an amplitude modulator that generates a modulated signal by amplifying power of the angle modulated signal according to an amplitude signal of the input signal;
a first generation section that generates a digital amplitude signal by performing analog to digital conversion on the amplitude signal;
a second generation section that generates a digital angle modulated signal corresponding to a signal obtained by performing analog to digital conversion on the angle modulated signal;
a multiplier that generates, in a pseudo manner, a digital modulated signal corresponding to a signal that is obtained by performing analog to digital conversion on the modulated signal, by multiplying the digital amplitude signal by the digital angle modulated signal;
a distortion calculation section that calculates distortion of the digital modulated signal;
an adjustment section that adjusts delay time until the amplitude signal is input to the amplitude modulator, or delay time until the angle modulated signal is input to the amplitude modulator; and
a control section that controls the delay time based on the distortion,
wherein:
the second generation section comprises:
an analog to digital converter that generates a digital angle signal by performing analog to digital conversion on the angle signal; and
a digital angle modulation section that generates the digital angle modulated signal in a baseband domain based on the digital angle signal,
wherein:
the angle signal is a frequency signal;
the digital angle signal is a digital frequency signal that is obtained by performing analog to digital conversion on the frequency signal;
the angle modulation section is a frequency modulator;
the digital angle modulation section comprises:
an integrator that generates a digital phase signal by integrating the digital frequency signal; and
a complex number calculation section that generates a digital real number signal and a digital imaginary number signal that are obtained by performing analog to digital conversion on a real number component and an imaginary number component of a phase signal using the digital phase signal, as the digital angle modulated signals; and
the multiplier comprises:
a first multiplier that generates a real number component of the digital modulated signal by multiplying the digital amplitude signal by the digital real number signal; and
a second multiplier that generates an imaginary number component of the digital modulated signal by multiplying the digital amplitude signal by the digital imaginary number signal; wherein:
the distortion calculation section calculates the distortion using the real number component and the imaginary number component of the digital modulated signal.

6. A radio communication apparatus comprising:
an antenna;
the transmission apparatus according to claim 5:
a reception apparatus; and
an antenna duplexer for sharing the antenna in the transmission apparatus and the reception apparatus.

7. A transmission apparatus comprising:
an angle modulation section that generates an angle modulated signal in a radio frequency domain using an angle signal of an input signal;
an amplitude modulator that generates a modulated signal by amplifying power of the angle modulated signal according to an amplitude signal of the input signal;
a first generation section that generates a digital amplitude signal by performing analog to digital conversion on the amplitude signal;
a second generation section that generates a digital angle modulated signal corresponding to a signal obtained by performing analog to digital conversion on the angle modulated signal;
a multiplier that generates, in a pseudo manner, a digital modulated signal corresponding to a signal that is obtained by performing analog to digital conversion on the modulated signal, by multiplying the digital amplitude signal by the digital angle modulated signal;
a distortion calculation section that calculates distortion of the digital modulated signal;
an adjustment section that adjusts delay time until the amplitude signal is input to the amplitude modulator, or delay time until the angle modulated signal is input to the amplitude modulator; and
a control section that controls the delay time based on the distortion,
wherein:
the angle signal is a frequency signal; and
the angle modulation section is a frequency modulator and comprises:
a subtractor;
a filter that removes an unnecessary component from a result of subtraction in the subtractor;
an oscillator that oscillates at a frequency corresponding to an output level of the filter and generates a high-frequency signal; and
a frequency detection section that detects a frequency of the high-frequency signal and outputs a result of the detection as a digital frequency signal; wherein:
the subtractor compares the frequency signal and the digital frequency signal; and
the second generation section comprises:
an integrator that generates a digital phase signal by integrating the digital frequency signal; and
a complex number calculation section that generates the digital angle modulated signal by performing complex number calculation on the digital phase signal.

8. A radio communication apparatus comprising:
an antenna;
the transmission apparatus according to claim 7:
a reception apparatus; and
an antenna duplexer for sharing the antenna in the transmission apparatus and the reception apparatus.

* * * * *